(12) United States Patent
Zhang et al.

(10) Patent No.: US 9,740,059 B2
(45) Date of Patent: Aug. 22, 2017

(54) ARRAY SUBSTRATE AND DISPLAY PANEL THEREOF

(71) Applicants: Shanghai AVIC OPTO Electronics Co., Ltd., Shanghai (CN); Tianma Micro-electronics Co., Ltd., Shenzhen (CN)

(72) Inventors: Weiwei Zhang, Shanghai (CN); Jun Li, Shanghai (CN); Meilin Wang, Shanghai (CN)

(73) Assignees: SHANGHAI AVIC OPTO ELECTRONICS CO., LTD., Shanghai (CN); TIANMA MICRO-ELECTRONICS CO., LTD., Shenzhen (CN)

( * ) Notice: Subject to any disclaimer, the term of this patent is extended or adjusted under 35 U.S.C. 154(b) by 0 days.

(21) Appl. No.: 15/134,350

(22) Filed: Apr. 20, 2016

(65) Prior Publication Data

US 2017/0160603 A1 Jun. 8, 2017

(30) Foreign Application Priority Data

Dec. 8, 2015 (CN) .......................... 2015 1 0900925

(51) Int. Cl.
| | | |
|---|---|---|
| *H01L 21/00* | (2006.01) | |
| *G02F 1/1343* | (2006.01) | |
| *G02F 1/1335* | (2006.01) | |
| *H01L 27/12* | (2006.01) | |

(52) U.S. Cl.
CPC .. *G02F 1/134336* (2013.01); *G02F 1/133512* (2013.01); *G02F 1/133514* (2013.01); *H01L 27/1222* (2013.01); *G02F 2001/134345* (2013.01)

(58) Field of Classification Search
CPC ......... G02F 1/134336; G02F 1/133512; H01L 27/1222
See application file for complete search history.

(56) References Cited

U.S. PATENT DOCUMENTS

| | | | |
|---|---|---|---|
| 8,248,559 B2 | 8/2012 | Morita | |
| 8,345,209 B2 * | 1/2013 | Fujita | ................ G02F 1/133512 |
| | | | 349/146 |
| 9,268,190 B1 * | 2/2016 | Lin | ........................ G02F 1/1368 |
| (Continued) | | | |

FOREIGN PATENT DOCUMENTS

| | | |
|---|---|---|
| KR | 1020110130177 A | 12/2011 |
| KR | 1020120004119 A | 1/2012 |
| KR | 1020120011294 A | 2/2012 |

*Primary Examiner* — Laura Menz
(74) *Attorney, Agent, or Firm* — Anova Law Group, PLLC (57) ABSTRACT

An array substrate and a display panel are provided. The array substrate includes a non-display region and a display region including a plurality of pixel unit rows arranged in a first direction and extended in a second direction. Each pixel unit row includes at least one first-pixel unit having a first width in the first direction and a second width in the second direction. At least one pixel unit row includes at least one second-pixel unit having a third width in the first direction and a fourth width in the second direction, and the at least one second-pixel unit is disposed at one end or both ends of the pixel unit row. The second width is larger than or equal to the fourth width.

9 Claims, 8 Drawing Sheets (56) References Cited

U.S. PATENT DOCUMENTS

| | | | |
|---|---|---|---|
| 2011/0080487 A1* | 4/2011 | Venkataraman | H04N 5/2253 348/218.1 |
| 2014/0285742 A1* | 9/2014 | Kim | G02F 1/133345 349/43 |
| 2015/0303228 A1* | 10/2015 | Rohr | H01L 27/14603 250/366 |
| 2016/0117969 A1* | 4/2016 | Qin | G09G 3/2003 345/694 |
| 2016/0178940 A1* | 6/2016 | Yuan | G02F 1/133514 359/893 |
| 2016/0182897 A1* | 6/2016 | Asai | H04N 13/0409 348/51 |
| 2016/0187745 A1* | 6/2016 | Jin | G02F 1/134336 349/110 |
| 2017/0148365 A1* | 5/2017 | Xi | G09G 3/2003 |
| 2017/0160603 A1* | 6/2017 | Zhang | G02F 1/133512 |

\* cited by examiner

ARRAY SUBSTRATE AND DISPLAY PANEL THEREOF

CROSS-REFERENCES TO RELATED APPLICATIONS

This application claims the priority of Chinese patent application No. CN201510900925.6, filed on Dec. 8, 2015, the entire content of which is incorporated herein by reference.

FIELD OF THE DISCLOSURE

The present disclosure relates to the field of display technology and, more particularly, relates to an array substrate and a display panel thereof.

BACKGROUND

With the development of display technology, applications of display panels become more and more diversified. Display panels are adopted not only as regular-shaped screens for cell phones and computers, etc., but also as irregular-shaped or odd-shaped screens for wearable devices, such as smart watches.

A display region of an existing regular-shaped screen includes a plurality of pixel units with a same dimension. An irregular-shaped screen is designed based on the existing regular-shaped screen, in which an irregular-shaped display region is defined by an irregular-shaped boundary and a region beyond the irregular-shaped boundary is covered with opaque materials. Thus, pixel units located at the edge or the contour of the display region are divided by the irregular-shaped boundary, in which a portion of the pixel unit for displaying images, i.e., a display portion of the pixel unit, exhibits an irregular shape. Further, at the edge of the display region, the display portion of each pixel unit divided by the irregular-shaped boundary has a different shape and dimension, which results a color shift at the edge of the irregular-shaped screen. The color shift causes an obvious corrugated edge in the image displayed on the irregular-shaped screen, and significantly degrades the display performance at the edge of the irregular-shaped screen accordingly.

The disclosed array substrate and display panel thereof are directed to solve one or more problems in the art.

BRIEF SUMMARY OF THE DISCLOSURE

One aspect of the present disclosure provides an array substrate. The array substrate includes a non-display region and a display region including a plurality of pixel unit rows arranged in a first direction and extended in a second direction. Each pixel unit row includes at least one first-pixel unit having a first width in the first direction and a second width in the second direction. At least one pixel unit row includes at least one second-pixel unit having a third width in the first direction and a fourth width in the second direction, and the at least one second-pixel unit is disposed at one end or both ends of the pixel unit row. The second width is larger than or equal to the fourth width.

Another aspect of the present disclosure provides a display panel. The display panel includes a color film substrate and an array substrate having a non-display region and a display region. The display region includes a plurality of pixel unit rows arranged in a first direction and extended in a second direction. Each pixel unit row includes at least one first-pixel unit having a first width in the first direction and a second width in the second direction. At least one pixel unit row includes at least one second-pixel unit having a third width in the first direction and a fourth width in the second direction, and the at least one second-pixel unit is disposed at one end or both ends of the pixel unit row. The second width is larger than or equal to the fourth width.

Other aspects of the present disclosure can be understood by those skilled in the art in light of the description, the claims, and the drawings of the present disclosure.

BRIEF DESCRIPTION OF THE DRAWINGS

The following drawings are merely examples for illustrative purposes according to various disclosed embodiments and are not intended to limit the scope of the present disclosure.

DETAILED DESCRIPTION

Reference will now be made in detail to exemplary embodiments of the invention, which are illustrated in the accompanying drawings. Hereinafter, embodiments consistent with the disclosure will be described with reference to drawings. Wherever possible, the same reference numbers will be used throughout the drawings to refer to the same or like parts. It is apparent that the described embodiments are some but not all of the embodiments of the present invention. Based on the disclosed embodiments, persons of ordinary skill in the art may derive other embodiments consistent with the present disclosure, all of which are within the scope of the present invention.

Figure 1:
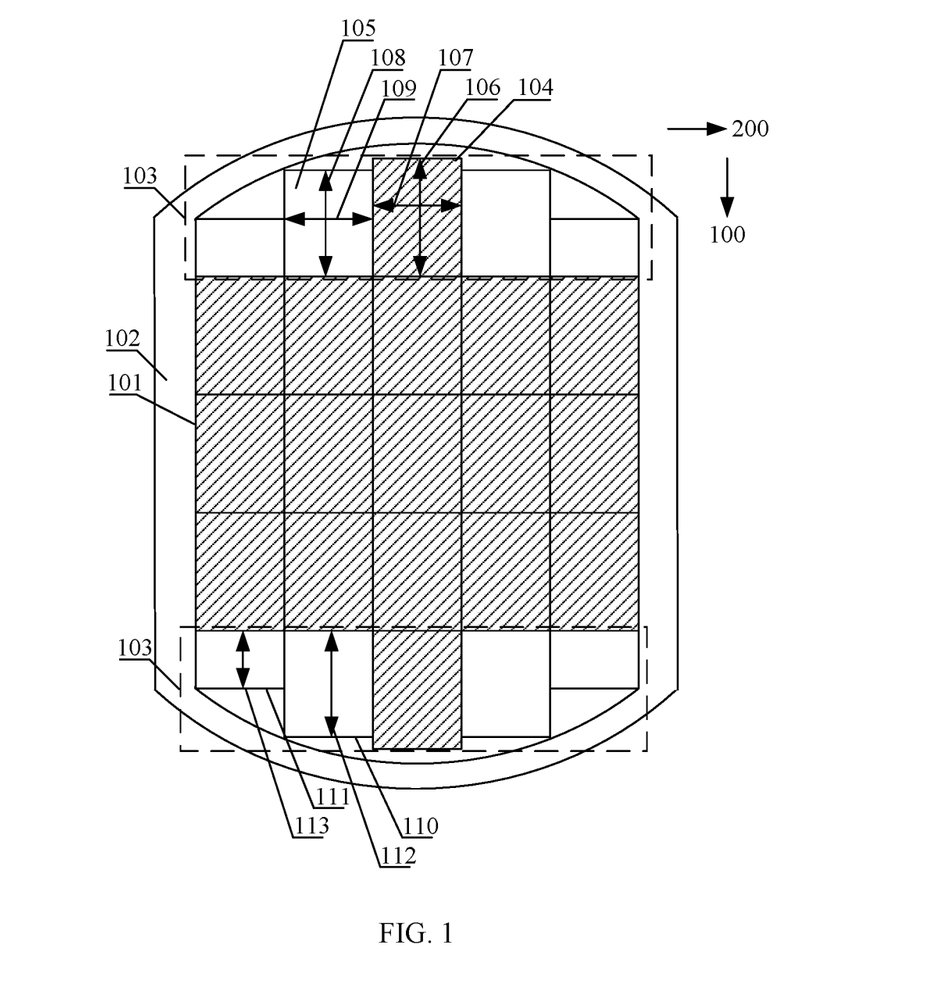
FIG. 1 illustrates a top view of an exemplary array substrate consistent with disclosed embodiments.

The present disclosure provides an array substrate. FIG. 1 illustrates a top view of an exemplary array substrate consistent with disclosed embodiments. As shown in FIG. 1, the array substrate may include a display region 101 and a non-display region 102.

The display region 101 may include a plurality of rows of pixel units 103 arranged in a first direction 100. A row of pixel units is also called as a pixel unit row in the following. The pixel unit row 103 may extend in a second direction 200. Each pixel unit row 103 may include at least one first-pixel unit 104, and at least one pixel unit row 103 may also include at least one second-pixel unit 105. The at least one second-pixel unit 105 may be disposed at one or both ends of the pixel unit row 103.

The first-pixel unit 104 may have a first width 106 in the first direction 100 and a second width 107 in the second direction 200. The second-pixel unit 105 may have a third width 108 in the first direction 100 and a fourth width 109 in the second direction 200. The first width 106 may be larger than the third width 108, and the second width 107 may be equal to the fourth width 109.

In the array substrate shown in FIG. 1, the display region may be designed to include the plurality of pixel unit rows arranged in the first direction and extended in the second direction, each pixel unit row may include at least one first-pixel unit and at least one pixel unit row may also include at least one second-pixel unit disposed at lone or both ends of the pixel unit row. Further, in the first direction, the width of the first-pixel unit may be larger than the width of the second-pixel unit, while in the second direction, the width of the first-pixel unit may be equal to the width of the second-pixel unit. That is, through designing the width of the second-pixel unit in the first direction (i.e., the second width) to be smaller than the width of the first-pixel unit in the first direction (i.e., the first width), each pixel unit (i.e., each first-pixel unit and each second-pixel unit) may have a complete shape (i.e., not divided by a boundary of the display region), which may improve the color shift at the edge of the display region. Thus, at the edge of the display region, the corrugated edge of the displayed image may be eliminated and the image performance may be improved accordingly.

It should be noted that, the first width 106 of the first-pixel unit 104 may be larger than the third width 108 of each second-pixel unit 105, while the third width 108 of each second-pixel unit 105 may be different.

The display region 101 may have a predetermined shape, which may be a non-rectangular shape. For example, the predetermined shape may be not rectangular (or square) but may be circular or oval. As shown in FIG. 1, the display region 101 may have an oblong shape (i.e., a circular shape or an elliptical shape being elongated in the first direction 100) or a convex side rectangular shape (i.e., the two convex sides are in the second direction 200 and the two parallel straight sides are in the first direction 100).

It should be noted that, the dimension, the number and the arrangement of the first-pixel units 104 and the second-pixel units 105 may be designed according to the shape and dimension of the display region 101, respectively. For example, the dimension, the number and the arrangement of the first-pixel units 104 and the second-pixel units 105 may be designed through certain algorithms, such as an iterative algorithm. It may be desired that the remaining region in the display region 101 beyond the first-pixel units 104 and the second-pixel units 105 may have a minimized area. Thus, designing the dimension, the number and the arrangement of the first-pixel unit 104 and the second pixel unit 105 may be based on the display performance, the fabrication process and/or other factors. The designing may also be iteratively modified for particular products.

In certain embodiments, at least two second-pixel units 105 may be disposed at one end of the pixel unit row 103, the third widths 108 of the at least two second-pixel units 105 may be equal or gradually decreased in a direction away from the first-pixel unit 104. That is, the third width 108 of the second-pixel unit 105 may be gradually decreased as the distance away from the first-pixel unit 104 increases. For the second-pixel units disposed at two ends of the pixel unit row, the direction away from the first-pixel unit may be opposite. For example, as shown in FIG. 1, for the two second-pixel units 105 disposed at a right end of the pixel unit row 103, the direction away from the first-pixel unit 104 may be along the second direction 200. While for the two second-pixel units 105 disposed at a left end of the pixel unit row 103, the direction away from the first-pixel unit 104 may be along the opposite second direction.

It should be noted that, whether the third width 108 of the second-pixel unit 105 are equal or gradually decreased in the direction away from the first-pixel unit 104 may be designed according to the shape and dimension of the display region 101, the dimension of the first-pixel unit 104 and the dimension of the second-pixel unit 105.

As shown in FIG. 1, two second-pixel units may be disposed at each end of the pixel unit row 103: a first second-pixel unit 110 and a second second-pixel unit 111. A third width 112 of the first second-pixel unit 110 may be larger than a third width 113 of the second second-pixel unit 110.

However, in certain embodiments, in the first direction, the width of the first-pixel unit may be smaller than the width of the second-pixel unit and, meanwhile, in the second direction, the width of the first-pixel unit may be larger than or equal to the width of the second-pixel unit. For example, when the display region 101 has a concave side rectangular shape, in which the two concave sides may be in the second direction 200 while the two parallel straight sides may be in the first direction 100. The second width 107 may be equal to the fourth width 109, and the first width 106 of the first-pixel unit 104 may be smaller than the third width 108 of each second-pixel unit 105, while the third width 108 of each second-pixel unit 105 may be different. In certain embodiments, at least two second-pixel units 105 may be disposed at one end of the pixel unit row 103, the third widths 108 of the at least two second-pixel units 105 may be equal or gradually increased in the direction away from the first-pixel unit 104. That is, the third width 112 of the first second-pixel unit 110 may be smaller than the third width 113 of the second second-pixel unit 110. Further, whether the third width 108 of the second-pixel unit 105 are equal or gradually increased in the direction away from the first-pixel unit 104 may be designed according to the shape and dimension of the display region 101, the dimension of the first-pixel unit 104 and the dimension of the second-pixel unit 105.

Figure 2:
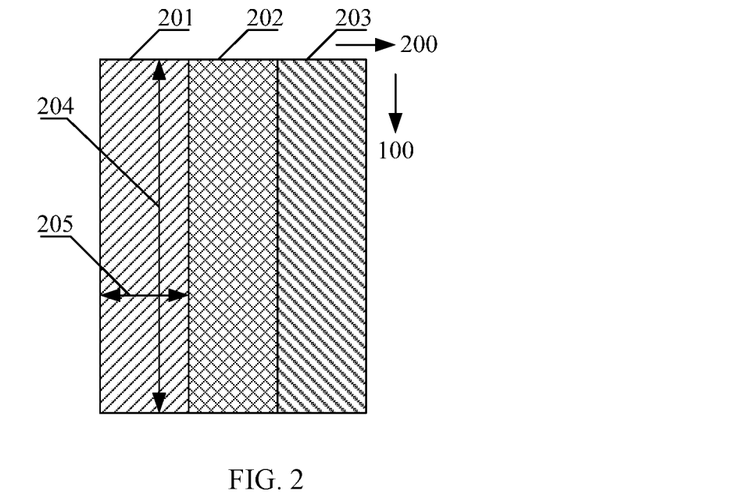
FIG. 2 illustrates a top view of a first-pixel unit in an exemplary array substrate in FIG. 1 consistent with disclosed embodiments.

FIG. 2 illustrates a top view of a first-pixel unit in an exemplary array substrate in FIG. 1 consistent with disclosed embodiments. As shown in FIG. 2, the first-pixel unit may include a plurality of first sub-pixels. The first-pixel unit may include three sub-pixels sequentially arranged: a first red sub-pixel 201, a first green sub-pixel 202 and a first blue sub-pixel 203.

Further, each first sub-pixel may have a rectangular shape, and each first sub-pixel may have a same width in the first direction 100 and a same width in the second direction 200, respectively.

In particular, the first sub-pixel may have a fifth width 204 in the first direction 100 and a sixth width 205 in the second direction 200, and the fifth width 204 may be larger than the sixth width 205.

Figure 3:
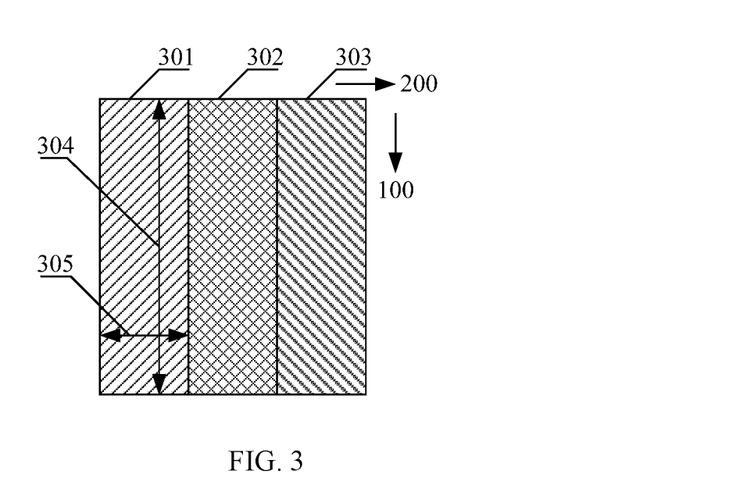
FIG. 3 illustrates a top view of a second-pixel unit in an exemplary array substrate in FIG. 1 consistent with disclosed embodiments.

FIG. 3 illustrates a top view of a second-pixel unit in an exemplary array substrate in FIG. 1 consistent with disclosed embodiments. As shown in FIG. 3, the second-pixel unit may include a plurality of second sub-pixels.

In particular, the colors, the number and the arrangement of the second sub-pixels included in the second-pixel unit may be same as the colors, the number and the arrangement of the first sub-pixels included in the first-pixel unit in FIG. 2, respectively. Such a design may enable a more consistent image displaying across the whole display region. That is, the second-pixel unit may also include three sub-pixels sequentially arranged: a second red sub-pixel 301, a second green sub-pixel 302 and a second blue sub-pixel 303. Further, each second sub-pixel may have a rectangular shape, and each second first sub-pixel may have a same width in the first direction 100 and a same width in the second direction 200, respectively.

The second sub-pixel may have a seventh width 304 in the first direction 100 and an eighth width 305 in the second direction 200. Referring to FIG. 2 and FIG. 3, the fifth width 204 may be larger than the seventh width 304, and the sixth width 205 may be equal to the eighth width 305. Thus, the first-pixel unit and the second-pixel unit may have a same width along a short side of the first-pixel unit (i.e., the second direction 200) and a different width along a long side of the first-pixel unit (i.e., the first direction 100). More space may be reserved for thin-film-transistors (TFTs) to be disposed in the pixel units (i.e., first-pixel units and the second-pixel units). Thus, a layout design of the TFTs may not be affected.

For example, in the field of liquid crystal display (LCD), the standard equipment is tuned to manufacture rectangular-shaped display screens. In a pixel unit having multiple sub-pixels, each sub-pixel may be controlled by a TFT, and a plurality of TFTs may be arranged in a matrix on the array substrate. TFTs may be switching transistors, and the drain of the TFT may be connect to the liquid crystal which may be equivalent to a capacitor in a circuit. To address a particular sub-pixel, the proper row may be switched on, and then a voltage may be sent down the correct column. Because all the other rows that the column intersects are turned off, only the LC capacitor at the designated sub-pixel may receive the voltage. The LC capacitor may be able to hold the voltage until the next refresh cycle, i.e., the sub-pixel may keep switched on until the next refresh cycle.

If an irregular-shaped display screen (e.g. circular or triangular or oval) is needed, cutting off a piece of the necessary shape (i.e., cutting off some pixel units and the corresponding TFTs) from the ready-made (i.e., rectangular-shaped) display screen may be impossible. Instead, a mask of proper shape may be used to cover the standard rectangular-shaped display screen. For example, to get the oblong-shaped display region (i.e., the display screen) shown in FIG. 1, a mask having a corresponding oblong-shaped transparent region may be used to cover the standard rectangular-shaped display screen, while the remained region of the standard rectangular-shaped display screen may be covered by the opaque region of the mask.

Because the first-pixel unit and the second-pixel unit may have a same width along a short side of the first-pixel unit (i.e., the second direction 200) and a different width along a long side of the first-pixel unit (i.e., the first direction 100), the layout of the TFTs in the standard rectangular-shaped display screen may not be affected, i.e., may still be applicable in the oblong-shaped display screen. Or the TFT layout in the oblong-shaped display screen may be similar to the standard rectangular-shaped display screen, while not affected by the irregular-shaped display screen.

Further, irregular-shaped LCD display screens are often manufactured based on active LCD matrix technologies involving low-temperature polysilicon TFTs (p-Si TFT). The p-Si TFTs switch so fast that that they can be used to make up the driving circuit connected to the pixel units. Thus, the driving circuits may be integrated right onto the array substrate instead of residing on a separate circuit board. The integration reduces the number of connections at the edge of the display screen, freeing up enough of the array substrate to make circles and other shapes possible.

Further, the pixel units in FIG. 2 and FIG. 3 (i.e., the first-pixel unit and the second pixel unit) may be single-domain pixel units. According to practical requirements, the pixel units may also be multi-domain pixel units.

Figure 4:
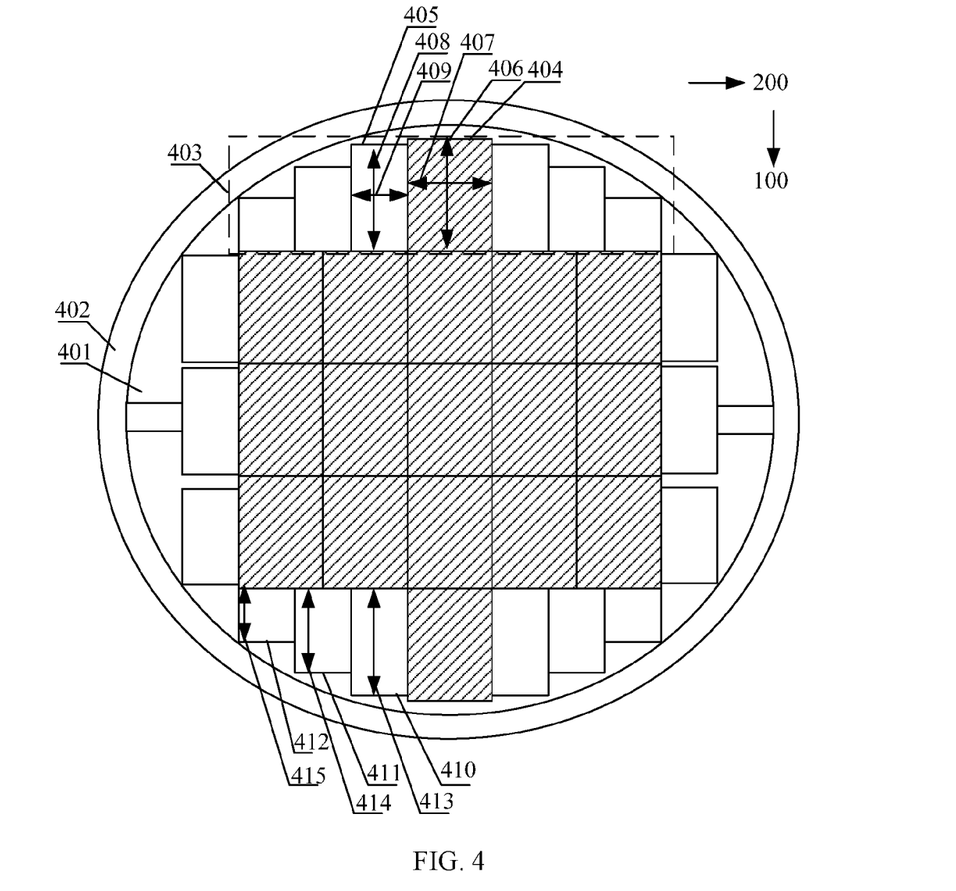
FIG. 4 illustrates a top view of another exemplary array substrate consistent with disclosed embodiments.

FIG. 4 illustrates a top view of another exemplary array substrate consistent with disclosed embodiments. As shown in FIG. 4, the array substrate may include a display region 401 and a non-display region 402. The display region 401 may include a plurality of pixel unit rows 403 arranged in a first direction 100. The pixel unit row 403 may extend in a second direction 200. Each pixel unit row 403 may include at least one first-pixel unit 404, at least one pixel unit row 403 may also include at least one second-pixel unit 405. The at least one second-pixel unit 405 may be disposed at one end or both ends of the pixel unit row 403.

The first-pixel unit 404 may have a first width 406 in the first direction 100 and a second width 407 in the second direction 200. The second-pixel unit 405 may have a third width 408 in the first direction 100 and a fourth width 409 in the second direction 200. The first width 406 may be larger than the third width 408, and the second width 407 may be larger than the fourth width 409.

In the array substrate shown in FIG. 4, the display region may be designed to include the plurality of pixel unit rows arranged in the first direction and extended in the second direction, each pixel unit row may include at least one first-pixel unit, and at least one pixel unit row may also include at least one second-pixel unit. The at least one second-pixel unit may be disposed at one end or both ends of the pixel unit row. Further, in the first direction, the width of the first-pixel unit may be larger than the width of the second-pixel unit and, meanwhile, in the second direction, the width of the first-pixel unit may be larger than the width of the second-pixel unit. That is, through designing the width of the second-pixel unit in the first direction (i.e., the second width) to be smaller than the width of the first-pixel unit in the first direction (i.e., the first width), each pixel unit (i.e., the first-pixel units and second-pixel units) may have a complete shape, which may improve the color shift at the edge of the display region. Thus, at the edge of the display region, the corrugated edge of the displayed image may be eliminated and the image performance may be improved accordingly.

It should be noted that, the first width 406 of the first-pixel unit 404 may be set to be larger than the third width 408 of each second-pixel unit 405, while the third width 408 of each second-pixel unit 405 may be different. On the other hand, the second width 407 of the first-pixel unit 404 may be set to be larger than the fourth width 408 of each second-pixel unit 405, while the fourth width 409 of each second-pixel unit 405 may be different.

The display region 401 may have a predetermined shape, which may be a non-rectangular shape. For example, the predetermined shape may be not rectangular (or square) but may be circular or oval. As shown in FIG. 4, the display region 401 may have a circular shape.

It should be noted that, the dimension, the number and the arrangement of the first-pixel unit 404 and the second pixel unit 405 may be designed respectively, according to the shape and dimension of the display region 401. For example, the dimension, the number and the arrangement of the first-pixel units 404 and the second-pixel units 405 may be designed through certain algorithms, such as an iterative algorithm. It may be desired that the remaining region in the display region 401 beyond the first-pixel units 404 and the second-pixel units 405 may have a minimized area. Thus, designing the dimension, the number and the arrangement of the first-pixel unit 404 and the second pixel unit 405 may be based on the display performance, the fabrication process and/or other factors. The designing may also be iteratively modified for particular products.

In certain embodiments, at least two second-pixel units 405 may be disposed at one end of the pixel unit row 403, the third widths 408 of the at least two second-pixel units 405 may be equal or gradually decreased in a direction away from the first-pixel unit 404. That is, the third width 408 of the second-pixel unit 405 may be gradually decreased as the distance away from the first-pixel unit 404 increases. For the second-pixel units 405 located at two ends of the pixel unit row 403, the direction away from the first-pixel unit 404 may be opposite.

It should be noted that, whether the third width 408 of the second-pixel unit 405 are equal or gradually decreased in the direction away from the first-pixel unit 404 may be designed according to the shape and dimension of the display region 401, the dimension of the first-pixel unit 404 and the dimension of the second-pixel unit 405.

As shown in FIG. 4, three second-pixel units may be disposed at each end of the pixel unit row 403: a third second-pixel unit 410, a fourth second-pixel unit 411 and a fifth second-pixel unit 412. In particular, a third width 413 of the third second-pixel unit 410 may be larger than a third width 414 of the fourth second-pixel unit 411, and a third width 414 of the fourth second-pixel unit 411 may be larger than a third width 415 of the fifth second-pixel unit 415.

However, in certain embodiments, in the first direction, the width of the first-pixel unit may be smaller than the width of the second-pixel unit and, meanwhile, in the second direction, the width of the first-pixel unit may be larger than the width of the second-pixel unit. For example, when the display region 401 has a cushion or pillow shape. The second width 407 may be larger than the fourth width 409, while the fourth width 409 of each second-pixel unit 405 may be different and, meanwhile, the first width 406 of the first-pixel unit 404 may be smaller than the third width 408 of each second-pixel unit 405, while the third width 408 of each second-pixel unit 405 may be different. In certain embodiments, at least two second-pixel units 405 may be disposed at one end of the pixel unit row 403, the third widths 408 of the at least two second-pixel units 405 may be equal or gradually increased in a direction away from the first-pixel unit 404. Whether the third width 408 of the second-pixel unit 405 are equal or gradually increased in the direction away from the first-pixel unit 404 may be designed according to the shape and dimension of the display region 401, the dimension of the first-pixel unit 404 and the dimension of the second-pixel unit 405.

Figure 5:
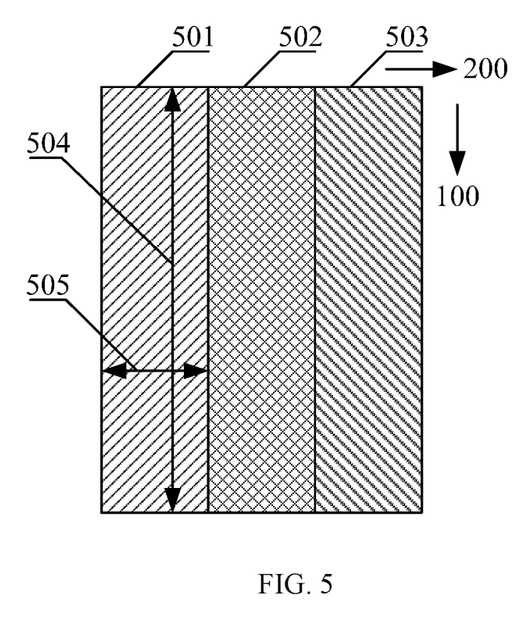
FIG. 5 illustrates a top view of a first-pixel unit in another exemplary array substrate in FIG. 4 consistent with disclosed embodiments.

FIG. 5 illustrates a top view of a first-pixel unit in another exemplary array substrate in FIG. 4 consistent with disclosed embodiments. As shown in FIG. 5, the first-pixel unit may include a plurality of first sub-pixels. The first-pixel unit may include three sub-pixels sequentially arranged: a first red sub-pixel 201, a first green sub-pixel 202 and a first blue sub-pixel 203.

Further, each first sub-pixel may have a rectangular shape, and each first sub-pixel may have a same width in a first direction 100 and a second direction 200, respectively.

In particular, the first sub-pixel may have a fifth width 504 in the first direction 100 and a sixth width 505 in the second direction 200, and the fifth width 504 may be larger than the sixth width 505.

Figure 6:
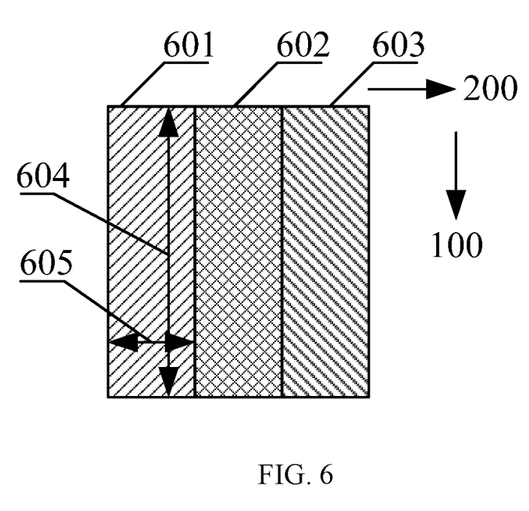
FIG. 6 illustrates a top view of a second-pixel unit in another exemplary array substrate in FIG. 4 consistent with disclosed embodiments.

FIG. 6 illustrates a top view of a second-pixel unit in an exemplary array substrate in FIG. 4 consistent with disclosed embodiments. As shown in FIG. 6, the second-pixel unit may include a plurality of second sub-pixels.

In particular, the colors, the number and the arrangement of the second sub-pixels included in the second-pixel unit may be same as the colors, the number and the arrangement of the first sub-pixels included in the first-pixel unit in FIG. 5, respectively. Such a design may enable a more consistent image displaying across the whole display region. That is, the second-pixel unit may also include three sub-pixels sequentially arranged: a second red sub-pixel 601, a second green sub-pixel 602 and a second blue sub-pixel 603. Further, each second sub-pixel may have a rectangular shape, and each second first sub-pixel may have a same width in a first direction 100 and a second direction 200, respectively.

The second sub-pixel may have a seventh width 604 in the first direction 100 and an eighth width 605 in the second direction 200. Referring to FIG. 5 and FIG. 6, the fifth width 504 may be larger than the seventh width 604, and the sixth width 505 may be larger than or equal to the eighth width 605.

Further, the pixel units in FIG. 5 and FIG. 6 (i.e., the first-pixel unit and the second pixel unit) may be single-domain pixel units. According to practical requirements, the pixel units may also be multi-domain pixel units.

Figure 7:
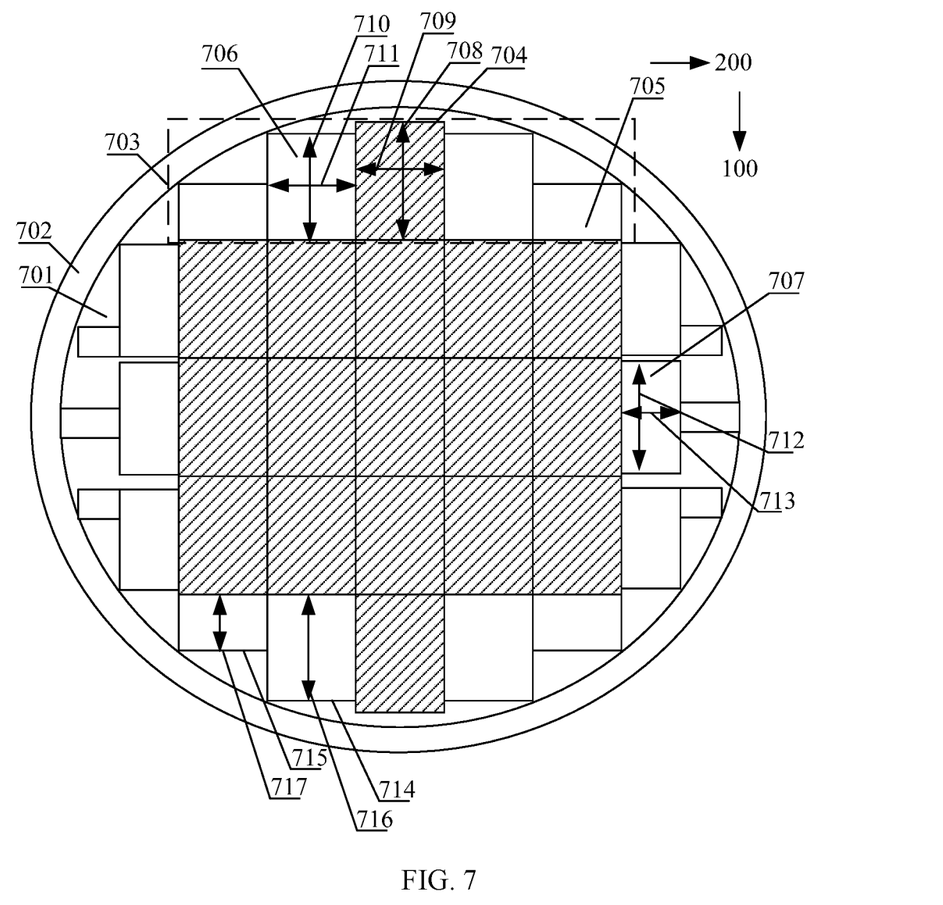
FIG. 7 illustrates a top view of another exemplary array substrate consistent with disclosed embodiments.

FIG. 7 illustrates a top view of another exemplary array substrate consistent with disclosed embodiments. As shown in FIG. 7, the array substrate may include a display region 701 and a non-display region 702. The display region 701 may include a plurality of pixel unit rows 703 arranged in a first direction 100. The pixel unit row 703 may extend in a second direction 200. Each pixel unit row 703 may include at least one first-pixel unit 704, and at least one pixel unit row 703 may also include at least one second-pixel unit 705. The at least one second-pixel unit 705 may be disposed at one end or both ends of the pixel unit row 703. Further, the second-pixel unit 705 may include two types of second-pixel units: a first type second-pixel unit 706 and a second type second-pixel unit 707.

The first-pixel unit 704 may have a first width 706 in the first direction 100 and a second width 707 in the second direction 200. The first type second-pixel unit 706 may have a first type third width 710 in the first direction 100 and a first type fourth width 711 in the second direction 200. The second type second-pixel unit 707 may have a second type third width 712 in the first direction 100 and a second type fourth width 713 in the second direction 200.

In particular, the first width 708 may be larger than the third width 710, and the second width 709 may be equal to the fourth width 711. The first width 708 may be larger than the second type third width 712, and the second width 709 may be larger than the second type fourth width 713.

In the array substrate shown in FIG. 7, the display region may be designed to include the plurality of pixel unit rows arranged in the first direction and extended in the second direction, each pixel unit row may include at least one first-pixel unit, at least one pixel unit row may also include at least one second-pixel unit. The at least one second-pixel unit may be disposed at one end or both ends of the pixel unit row. Further, in the first direction, the width of the first-pixel unit may be larger than the width of the second-pixel unit and, meanwhile, in the second direction, the width of the first-pixel unit may be larger than or equal to the width of the second-pixel unit. That is, through designing the width of the second-pixel unit in the first direction (i.e., the second width) to be smaller than or equal to the width of the first-pixel unit in the first direction (i.e., the first width), each pixel unit (i.e., the first-pixel units and second-pixel units) may have a complete shape, which may improve the color shift at the edge of the display region. Thus, at the edge of the display region, the corrugated edge of the displayed image may be eliminated and the image performance may be improved accordingly.

It should be noted that, the first width 708 of the first-pixel unit 704 may be set to be larger than the first type third width 710 of each first type second-pixel unit 706, while the first type third width 710 of each first type second-pixel unit 706 may be different.

The first width 708 of the first-pixel unit 704 may be set to be larger than the second type third width 712 of each second type second-pixel unit 707, while the second type third width 712 of each second type second-pixel unit 707 may be different.

The second width 709 of the first-pixel unit 704 may be set to be larger than the first type fourth width 711 of each first type second-pixel unit 706, while the first type fourth width 711 of each first type second-pixel unit 706 may be different.

The second width 709 of the first-pixel unit 704 may be set to be larger than the second type fourth width 713 of each second type second-pixel unit 707, while the second type fourth width 713 of each second type second-pixel unit 707 may be different.

The display region 701 may have a predetermined shape, which may be a non-rectangular shape. For example, the predetermined shape may be not rectangular (or square) but may be circular or oval. As shown in FIG. 7, the display region 701 may have a circular shape.

It should be noted that, the dimension, the number and the arrangement of the first-pixel unit 704 and the second pixel unit 705 may be designed respectively, according to the shape and dimension of the display region 701. For example, the dimension, the number and the arrangement of the first-pixel units 704 and the second-pixel units 705 may be designed through certain algorithms, such as an iterative algorithm. It may be desired that the remaining region in the display region 701 beyond the first-pixel units 704 and the second-pixel units 705 may have a minimized area. Thus, designing the dimension, the number and the arrangement of the first-pixel unit 704 and the second pixel unit 705 may be based on the display performance, the fabrication process and/or other factors. The designing may also be iteratively modified for particular products.

In certain embodiments, at least two second-pixel units 705 may be disposed at one end of the pixel unit row 703, the third widths of the at least two second-pixel units 705 may be equal or gradually decreased in a direction away from the first-pixel unit 704. That is, the third width 708 of the second-pixel unit 705 may be gradually decreased as the distance away from the first-pixel unit 704 increases. For the second-pixel units 705 located at two ends of the pixel unit row 703, the direction away from the first-pixel unit 704 may be opposite.

It should be noted that, whether the third width 708 of the second-pixel unit 705 are equal or gradually decreased in the direction away from the first-pixel unit 704 may be designed according to the shape and dimension of the display region 701, the dimension of the first-pixel unit 704 and the dimension of the second-pixel unit 705.

As shown in FIG. 7, two second-pixel units may be disposed at each end of the pixel unit row 703: a first second-pixel unit 714 and a second second-pixel unit 715. In particular, a third width 716 of the first second-pixel unit 714 may be larger than a third width 717 of the second second-pixel unit 715.

However, in certain embodiments, in the first direction, the width of the first-pixel unit may be smaller than the width of the second-pixel unit and, meanwhile, in the second direction, the width of the first-pixel unit may be larger than or equal to the width of the second-pixel unit. For example, when the display region 701 has a cushion or pillow shape. The first width 708 of the first-pixel unit 704 may be smaller than the first type third width 710 of each first type second-pixel unit 706, while the first type third width 710 of each first type second-pixel unit 706 may be different. The first width 708 of the first-pixel unit 704 may be smaller than the second type third width 712 of each second type second-pixel unit 707, while the second type third width 712 of each second type second-pixel unit 707 may be different. The second width 709 of the first-pixel unit 704 may be smaller than the first type fourth width 711 of each first type second-pixel unit 706, while the first type fourth width 711 of each first type second-pixel unit 706 may be different. The second width 709 of the first-pixel unit 704 may be smaller than the second type fourth width 713 of each second type second-pixel unit 707, while the second type fourth width 713 of each second type second-pixel unit 707 may be different. In certain embodiments, at least two second-pixel units 705 may be disposed at one end of the pixel unit row 703, the third widths of the at least two second-pixel units 705 may be equal or gradually increased in a direction away from the first-pixel unit 704. Whether the third width 708 of the second-pixel unit 705 are equal or gradually increased in the direction away from the first-pixel unit 704 may be designed according to the shape and dimension of the display region 701, the dimension of the first-pixel unit 704 and the dimension of the second-pixel unit 705.

Figure 8:
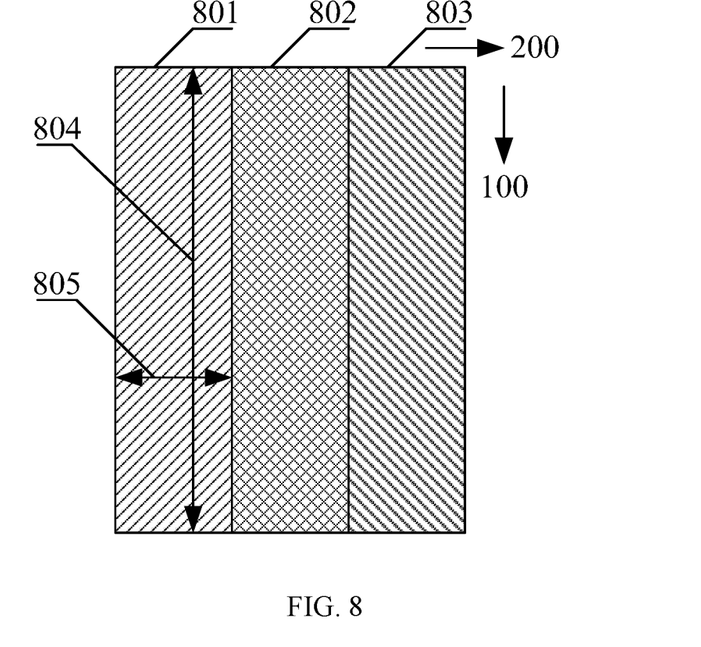
FIG. 8 illustrates a top view of a first-pixel unit in another exemplary array substrate in FIG. 7 consistent with disclosed embodiments.

FIG. 8 illustrates a top view of a first-pixel unit in another exemplary array substrate in FIG. 7 consistent with disclosed embodiments. As shown in FIG. 8, the first-pixel unit may include a plurality of first sub-pixels. The first-pixel unit may include three sub-pixels sequentially arranged: a first red sub-pixel 801, a first green sub-pixel 802 and a first blue sub-pixel 803.

Further, each first sub-pixel may have a rectangular shape, and each first sub-pixel may have a same width in a first direction 100 and a second direction 200, respectively.

In particular, the first sub-pixel may have a fifth width 804 in the first direction 100 and a sixth width 805 in the second direction 200, and the fifth width 804 may be larger than the sixth width 805.

Figure 9:
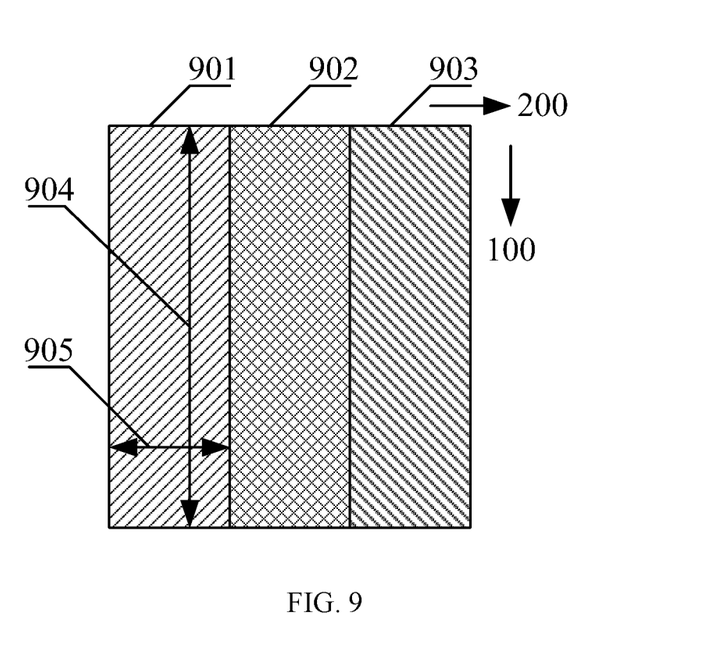
FIG. 9 illustrates a top view of a first type second-pixel unit in another exemplary array substrate in FIG. 7 consistent with disclosed embodiments.

FIG. 9 illustrates a top view of a first type second-pixel unit in an exemplary array substrate in FIG. 7 consistent with disclosed embodiments. As shown in FIG. 9, the first type second-pixel unit may include a plurality of first type second sub-pixels.

In particular, the colors, the number and the arrangement of the first type second sub-pixels included in the first type second-pixel unit may be same as the colors, the number and the arrangement of the first sub-pixels included in the first-pixel unit in FIG. 8, respectively. Such a design may enable a more consistent image displaying across the whole display region. That is, the first type second-pixel unit may also include three sub-pixels sequentially arranged: a second red sub-pixel 901, a second green sub-pixel 902 and a second blue sub-pixel 903. Further, each second sub-pixel may have a rectangular shape, and each second first sub-pixel may have a same width in a first direction 100 and a second direction 200, respectively.

The first type second sub-pixel may have a first type seventh width 904 in the first direction 100 and a first type eighth width 905 in the second direction 200. Referring to FIG. 8 and FIG. 9, the fifth width 804 may be larger than the first type seventh width 904, and the sixth width 805 may be equal to the first type eighth width 905.

Figure 10:
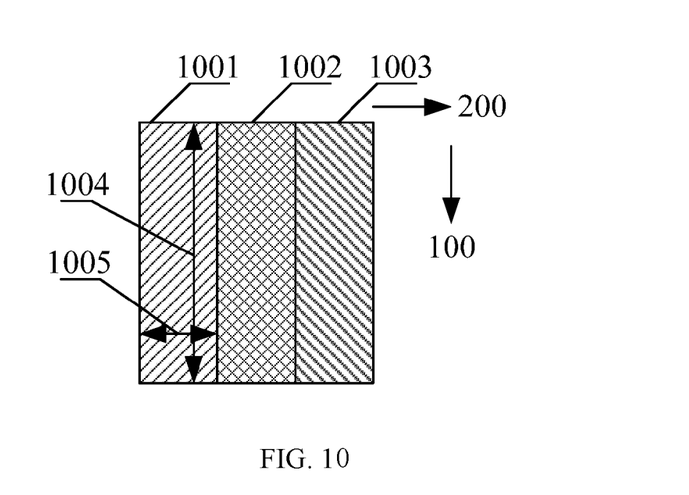
FIG. 10 illustrates a top view of a second type second-pixel unit in another exemplary array substrate in FIG. 7 consistent with disclosed embodiments.

FIG. 10 illustrates a top view of a second type second-pixel unit in an exemplary array substrate in FIG. 7 consistent with disclosed embodiments. As shown in FIG. 9, the second type second-pixel unit may include a plurality of second type second sub-pixels.

In particular, the colors, the number and the arrangement of the second type second sub-pixels included in the second type second-pixel unit may be same as the colors, the number and the arrangement of the first sub-pixels included in the first-pixel unit in FIG. 8, respectively. Such a design may enable a more consistent image displaying across the whole display region. That is, the second type second-pixel unit may also include three sub-pixels sequentially arranged: a second red sub-pixel 1001, a second green sub-pixel 1002 and a second blue sub-pixel 1003. Further, each second sub-pixel may have a rectangular shape, and each second first sub-pixel may have a same width in a first direction 100 and a second direction 200, respectively.

The second type second sub-pixel may have a second type seventh width 1004 in the first direction 100 and a second type eighth width 1005 in the second direction 200. Referring to FIG. 8 and FIG. 10, the fifth width 804 may be larger than the second type seventh width 1004, and the sixth width 805 may be equal to the second type eighth width 1005. Also referring to FIG. 8 and FIG. 9, the fifth width 804 may be larger than the first type seventh width 904, and the sixth width 805 may be equal to the first type eighth width 905. Thus, the first-pixel unit and the second-pixel unit may have a same width along a short side of the first-pixel unit (i.e., the second direction 200) and a different width along a long side of the first-pixel unit (i.e., the first direction 100). More space may be reserved for thin-film-transistors (TFTs) to be disposed in the pixel units (i.e., first-pixel units and the second-pixel units). Thus, a layout design of the TFTs may not be affected.

Further, the pixel units (i.e., the first-pixel unit and the second pixel unit) in FIGS. 8-10 may be single-domain pixel units. According to practical requirements, the pixel units may also be multi-domain pixel units.

The present invention further provides a display panel, which may include a color filter substrate and any one of the disclosed array substrates. The display panel may be a display panel utilizing a display medium, e.g. liquid crystal (LC) display panel, or a display panel utilizing self-lighting elements, e.g. organic light-emitting diode (OLED) display panel.

The display panel may be a smartphone, a tablet, a TV, a monitor, a notebook, a smartwatch, a GPS, etc. Further, the display panel may be any product or any component which is capable of displaying images and/or videos. In the display panel, the color filter substrate may be disposed opposite to the array substrate.

Figure 11:
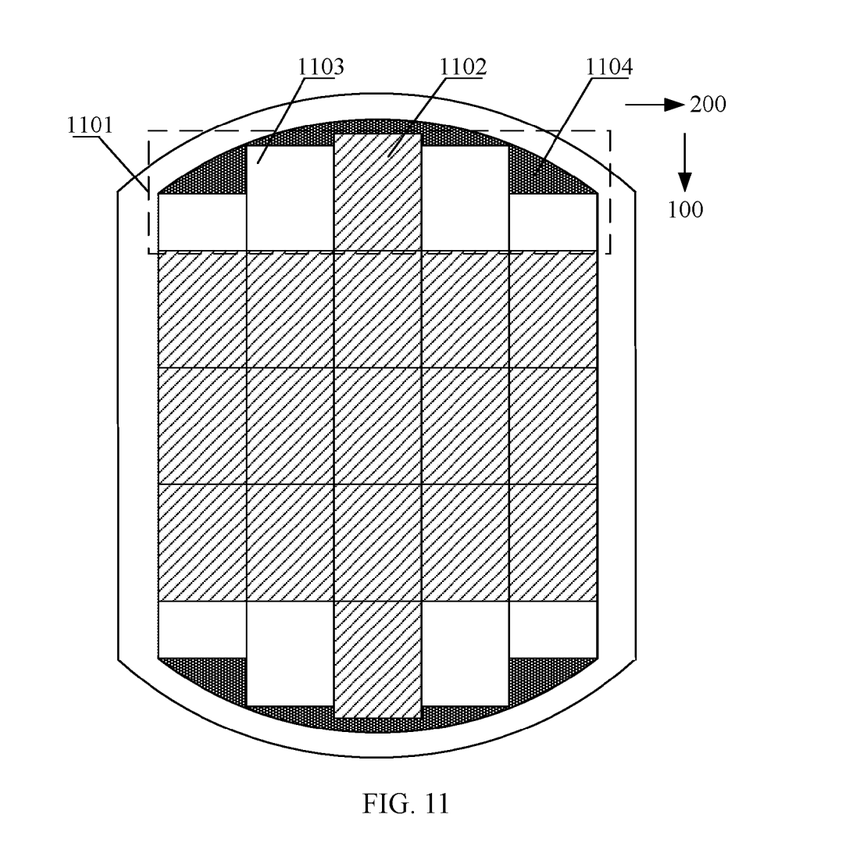
FIG. 11 illustrates a top view of an exemplary color film substrate consistent with disclosed embodiments.

FIG. 11 illustrates a top view of a color film substrate consistent with disclosed embodiments. As shown in FIG. 11, the color film substrate may include a plurality of rows of color filters 1101 arranged in a first direction 100. A row of color filters is also called as color filter row in the following. The color filter row 1101 may extend in a second direction 200. Each color filter row 1101 may include at least one first color filter unit 1102, and at least one color filter row 1101 may include at least one second color filter unit 1103 disposed at least one end of the color filter row 1101.

Figure 12:
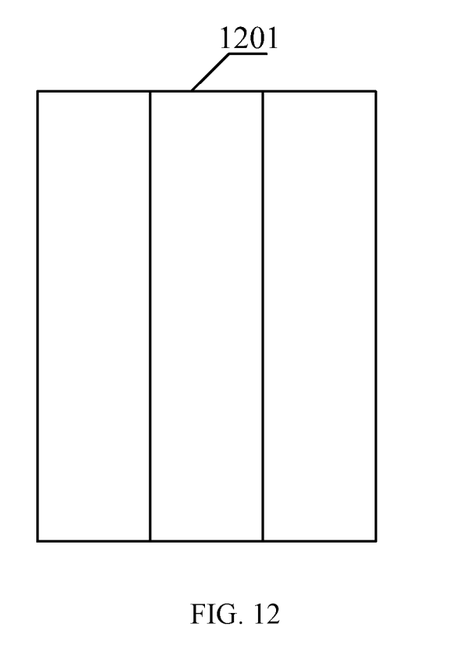
FIG. 12 illustrates a top view of a first color filter unit in an exemplary color film substrate in FIG. 11 consistent with disclosed embodiments.

FIG. 12 illustrates a top view of a first color filter unit in an exemplary color film substrate in FIG. 11 consistent with disclosed embodiments. As shown in FIG. 12, the first color filter unit may include a plurality of first color filter sub-units 1201. A projection of the first color filter sub-units 1201 on the array substrate may coincide with the first sub-pixels disposed on the array substrate.

Figure 13:
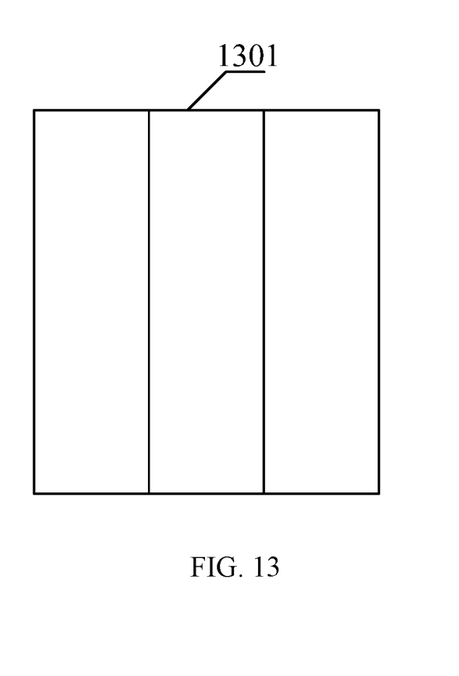
FIG. 13 illustrates a top view of a second color filter unit in an exemplary color film substrate in FIG. 11 consistent with disclosed embodiments.

FIG. 13 illustrates a top view of a second color filter unit in an exemplary color film substrate in FIG. 11 consistent with disclosed embodiments. As shown in FIG. 13, the second color filter unit may include a plurality of second color filter sub-units 1301. A projection of the second color filter sub-units 1301 on the array substrate may coincide with second sub-pixels disposed on the array substrate.

Returning to FIG. 11, the color filter substrate may further include a black matrix 1104. An orthographic projection of the black matrix 1104 on the array substrate may coincide with a region within the display region of the array substrate, in which the first-pixel units and the second units are not disposed. In the array substrates consistent with disclosed embodiments, the display region may have a predetermined non-rectangular shape, while the pixel units (i.e., the first-pixel units and the second-pixel units) may have a rectangular shape. Thus, the pixel units (i.e., the first-pixel units and the second-pixel units) may not fully fill the display region in the array substrate. Though covering the region within the display region, in which the first-pixel units and the second units are not disposed, the display performance may get enhanced.

FIG. 11 only shows a schematic structure of the color film substrate included in the display panel having the array substrate in FIG. 1. Based on the description of the color film substrate in FIG. 11, those skilled in the art would further reach other structures of the color film substrate corresponding to any array substrates consistent with disclosed embodiments.

In the disclosed array substrate, the width of the second-pixel unit in the second direction may be equal to or smaller than the width of the first-pixel unit in the second direction and, meanwhile, the width of the second-pixel unit in the first direction may be smaller than the width of the first-pixel unit in the first direction, such as in the display region having the convex side rectangular shape or the circular shape, or the width of the second-pixel unit in the first direction may be larger than the width of the first-pixel unit in the first direction, such as in the display region having the concave side rectangular shape, each pixel unit (i.e., each first-pixel unit and each second-pixel unit) may have a complete shape (i.e., not divided by a boundary of the display region). Thus, the color shift at the edge of the display region may be improved, at the edge of the non-rectangular shaped display region, the corrugated edge of the displayed image may be eliminated, and the image performance may be improved accordingly.

The disclosed display panel with the non-rectangular shaped display region may be able to display images without the corrugated edge. Such display panels may be used in wearable devices such as smartphones, or automobile dashboards in which circular display screens are used for speedometers and tachometers. A circular display screen would save precious space in a vehicle's crowded dashboard, which also requires room for car-navigation displays and other recent additions. Further, the disclosed display panels may become more and more attractive to advertisers since they enlarge the viewing angle, attract attention by their unconventional shapes, better merge with architectural landscape etc.

The description of the disclosed embodiments is provided to illustrate the present invention to those skilled in the art. Various modifications to these embodiments will be readily apparent to those skilled in the art, and the generic principles defined herein may be applied to other embodiments without departing from the spirit or scope of the invention. Thus, the present invention is not intended to be limited to the embodiments shown herein but is to be accorded the widest scope consistent with the principles and novel features disclosed herein.

What is claimed is:

1. A display panel, comprising:
    a color film substrate; and
    an array substrate having a non-display region and a display region,
    wherein the display region includes a plurality of pixel unit rows arranged in a first direction and extended in a second direction,
    each pixel unit row includes at least one first-pixel unit having a first width in the first direction and a second width in the second direction, the at least one first-pixel unit includes a plurality of first sub-pixels, a first sub-pixel has a fifth width in the first direction and a sixth width in the second direction, the fifth width is larger than the sixth width,
    at least one pixel unit row includes at least one second-pixel unit having a third width in the first direction and a fourth width in the second direction and disposed at one end or both ends of the pixel unit row, the at least one second-pixel unit includes a plurality of second sub-pixels, and
    the second width is larger than the fourth width.

2. The display panel according to claim 1, wherein the color film substrate further includes:
    a plurality of color filter rows arranged in a first direction and extended in a second direction, wherein
    each color filter row includes at least one first color filter unit, and
    at least one color filter row includes at least one second color filter unit disposed at one end or both ends of the color filter row.

3. The display panel according to claim 2, wherein:
    the at least one first color filter unit includes a plurality of first color filter sub-units, a projection of the first color filter sub-units on the array substrate coincides with the first sub-pixels disposed on the array substrate; and
    the at least one second color filter unit includes a plurality of second color filter sub-units, a projection of the second color filter sub-units on the array substrate coincides with the second sub-pixels disposed on the array substrate.

4. The display panel according to claim 1, further including:
    a black matrix disposed on the color film substrate, wherein an orthographic projection of the black matrix on the array substrate coincides with a region within the display region of the array substrate without the first-pixel units and the second-pixel units.

5. The display panel according to claim 1, wherein in the array substrate:
    at least two second-pixel units are disposed at one end of the pixel unit row, the first width is larger than the third width, and the third widths of the at least two second-pixel units are equal or gradually decreased in a direction away from the first-pixel unit.

6. The display panel according to claim 1, wherein in the array substrate:
    at least two second-pixel units are disposed at one end of the pixel unit row, the first width is smaller than the third width, and the third widths of the at least two second-pixel units are equal or gradually increased in a direction away from the first-pixel unit.

7. The display panel according to claim 1, wherein in the array substrate:
    the display region has a predetermined shape, and the predetermined shape is a non-rectangular shape.

8. The display panel according to claim 1, wherein in the array substrate:
    a second sub-pixel has a seventh width in the first direction and an eighth width in the second direction;
    the fifth width is larger than the seventh width; and
    the sixth width is larger than or equal to the eighth width.

9. The display panel according to claim 1, wherein in the array substrate:
    colors, a number and an arrangement of the plurality of second sub-pixels included in the second-pixel unit are same as the colors, a number and an arrangement of the plurality of first sub-pixels included in the first-pixel unit, respectively.

* * * * *